(12) United States Patent
Cheng et al.

(10) Patent No.: US 6,498,226 B2
(45) Date of Patent: Dec. 24, 2002

(54) CYCLOALIPHATIC POLYIMIDE, A METHOD FOR PRODUCING THE SAME, AND ITS USE

(75) Inventors: Kung-Lung Cheng, Hsinchu (TW); Shu-Chen Lin, I-Lan (TW); Wen-Ling Lui, I-Lan (TW); Chih-Hsiang Lin, Taipei (TW); Wei-Ling Lin, I-Lan Hsien (TW); Woan-Shiow Tzeng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/848,525

(22) Filed: May 3, 2001

(65) Prior Publication Data

US 2002/0120090 A1 Aug. 29, 2002

(30) Foreign Application Priority Data

Feb. 20, 2001 (TW) ........................... 90103779 A

(51) Int. Cl.$^7$ .................. C08G 73/10; C08G 69/26
(52) U.S. Cl. .................. 528/170; 528/125; 528/126; 528/128; 528/172; 528/173; 528/174; 528/176; 528/183; 528/188; 528/189; 528/190; 528/220; 528/229; 528/350; 528/351; 528/353; 522/164; 522/173; 522/176; 430/56; 430/269; 430/270.1; 430/283.1; 430/299; 430/311; 430/396; 430/495.1
(58) Field of Search ............. 528/172, 173, 528/353, 174, 125, 126, 128, 176, 183, 188, 189, 190, 220, 229, 350, 351; 522/164, 173, 176; 430/269, 270.1, 283.1, 299, 311, 396, 495.1, 56

(56) References Cited

U.S. PATENT DOCUMENTS 4,142,036 A * 2/1979 Feinstein et al. ............ 528/183
6,265,520 B1 * 7/2001 Kuo et al. .................. 528/170

OTHER PUBLICATIONS

Journal of Polym. Sci. Part A: Synthesis of Aliphatic Polyimides Containing Adamantyl Units, Hiroshi Seino, vol. 37(18); p. 3584–3590, Sep. 1999.*

* cited by examiner

Primary Examiner—P. Hampton-Hightower
(74) Attorney, Agent, or Firm—Darby & Darby

(57) ABSTRACT

This invention provides cycloaliphatic polyimide having the following formula (I):

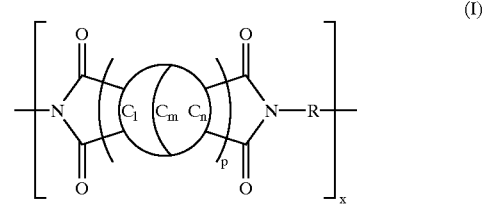

R: cyclic aliphatic group wherein 1 and n are integers from 4 to 7; m is an integer from 0 to 2; p is an integer from 1 to 8; polycyclic aliphatic compound R reprents $C_{1-8}$ cycloalkyl, cycloalkenyl, cycloalkynyl, norbornenyl, decalinyl, adamantanyl, or cubanyl. That cycloaliphatic polyimide can be a through transparent film, their thermal stability is over 430° C. and dielectric constant is about 2.7.

9 Claims, No Drawings

CYCLOALIPHATIC POLYIMIDE, A METHOD FOR PRODUCING THE SAME, AND ITS USE

BACKGROUND OF THE INVENTION

1. Field of the Invention

The present invention relates in general to a cycloaliphatic polyimide (or called polycyclic aliphatic polyimide or alicyclic polyimide) a method for producing the same, and its use. In particular, the present invention relates to a cycloaliphatic polyimide with heat-resistance, low dielectric constant, and high transparency.

2. Description of the Related Art

Polyimide is an important polymer in the microelectronics and photoelectronics industries. It is widely applied in photoresist, passivation or dielectric film, soft print circuit board, and optics film and alignment films of the display. The polyimide used in the photoresist is photosensitive, and can be patterned by photolithography and used to transfer the pattern into the underlayer. The photosensitive polyimide also can form the passivation or dielectric film with heat-resistant and corrosion-resistant characteristics. The thermosensitive polyimide is used in the fabrication of soft print circuit boards, optics film and alignment film. In general, the polyimide has the properties of heat-resistance, low dielectric constant, and high transparency, which are the trend of the future development.

The precursors of the polyimide resin are thermo-cured polyamic acids or photo-cured polyamic esters. The thermo-cured polyamic acid is formed by the polycondensation of aromatic dianhydride with aromatic diamine. If an acrylate is also added to react with the aromatic diamine and the aromatic dianhydride, the reaction, the radical polymerization, is initiated by light, after post-curing, to form the polyimide film.

In Japan patent 1181091 and U.S. Pat. No. 4,778,859, aliphatic or alkynyl sidechains, or ethylene glycol bis(3-aminopropyl) ether and diamino siloxane are introduced into the aromatic polyimide to reduce the inter-molecular charge-transfer interaction and enhance transmittance and solubility. However, the intra-molecular charge-transfer interaction cannot be reduced to prepare the thoroughly transparent polyimide film, and its thermal stability is insufficient.

In Japan patents 07018074 and 03188163, the fluoro-based compound is employed as the reactant. Although the optical properties of the resulting polyimide are improved, and its dielectric constant is reduced to 3.0, the cost is too high to have economic benefits.

SUMMARY OF THE INVENTION

It is an object of this invention to develop a new cycloaliphatic polyimide and the method for producing the same. Such cycloaliphatic polyimide is rigid and polycyclic, and it has the properties of thermal stability, thorough transparency and lower dielectric constant required for application in the microelectrics and optoelectrics industries.

Therefore, the present invention provides a cycloaliphatic polyimide with the following formula (I)

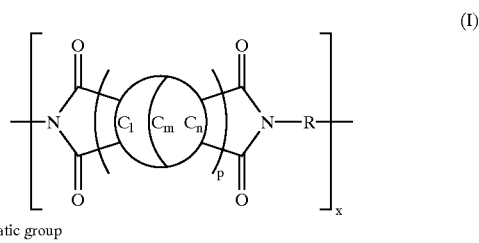

R: cyclic aliphatic group wherein $C_l$, $C_m$ and $C_n$ can be alkyl or alkenyl, l is an integer from 4 to 7, n is an integer from 4 to 7, m is an integer from 0 to 2, and p is an integer from 1 to 8.

In such cycloaliphatic polyimide, cyclic aliphatic group R can be $C_{1-8}$ cycloalkyl, cycloalkenyl, cycloalkynyl, norbornenyl, decalinyl, adamantanyl, or cubanyl.

The above-mentioned cycloaliphatic polyimide can be applied in photoresist, passivation film, dielectric film, optics film, and alignment film.

Preparation of the cycloaliphatic polyimide

A polycondensation is proceeded by reacting the polycyclic aliphatic diamine having the following formula (II) with the polycyclic aliphatic dianhydride having the following formula (III) to form the product, polycyclic aliphatic polyamic acid or polycyclic aliphatic polyamic ester, having the following formula (IV). The product was converted to the cycloaliphatic polyimide having the following formula (I) when taking the cyclic reaction.

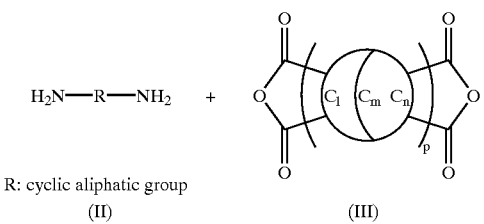

R: cyclic aliphatic group
(II) (III)

↓ polycondensation

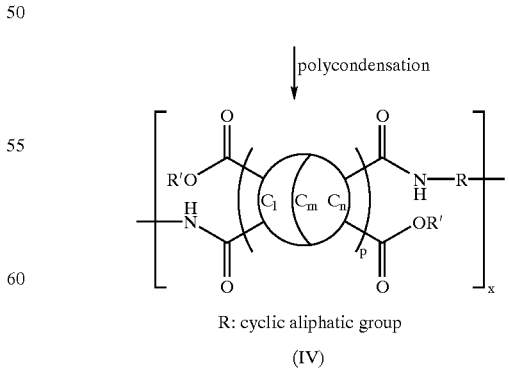

R: cyclic aliphatic group
(IV)

↓ cyclic reaction

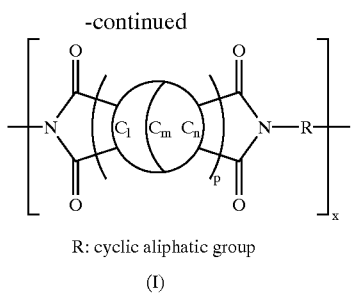

R: cyclic aliphatic group (I)

wherein $C_l$, $C_m$ and $C_n$ can be alkyl or alkenyl, l and n are integers from 4 to 7, m is an integer from 0 to 2, p is an integer from 1 to 8, x is an integer equal to or greater than 1, cyclic aliphatic group R can be $C_{1-8}$ cycloalkyl, cycloalkenyl, cycloalkynyl, norbornenyl, decalinyl, adamantanyl, or cubanyl, and R' can be hydrogen or acrylate group.

In the polycyclic aliphatic diamine having the following formula (II), the cyclic aliphatic group R can be $C_{1-8}$ cycloalkyl, cycloalkenyl, cycloalkynyl, norbornenyl, decalinyl, adamantanyl, or cubanyl. A specific example is 1,3-diamino adamantane.

In such polycyclic aliphatic dianhydride having the following formula (III), the repeating unit of its cyclic aliphatic structure is a cyclic system constituted by two the same or different $C_{4-7}$ alkyl or alkenyl, and $C_{0-2}$ alkyl or alkenyl as a bridged group. Specific examples are bicyclo[2.2.2]oct-7-ene-2,3,5,6-tetracarboxylic dianhydride, and pentacyclo [$8.2.1.4^{,7}0^{2,9}0^{3,8}$]tetradecane-5,6,11,12-tetracar-boxylic dianhydride.

The polycondensation and cyclic reaction depicted above are proceeded in polar aprotic solvent which can in general be 1-methyl-2-pyrrolidinone (NMP), N,N-dimethyl acetamide, tetrahydroxythiophene-1,1-dioxide, N,N-dimethyl formamide (DMF), dimethyl sulfoxide (DMSO), tetramethyl urea, or γ-butyrolactone.

The polycondensated product (IV) can be thermo-cured polycyclic aliphatic polyimic acid or photo-cured polycyclic aliphatic polyamic ester. If R' is H, the product (IV) is the former. If R' is the acrylate group, the product (IV) is the latter.

In the preparation of the photosensitive cycloaliphatic polyimide, the acrylate is further added to take the polycondensation. The acrylate can be trimethylolpropane triacrylate (TMPTA), hydroxyethyl methacrylate (2-HEMA), hexanediol diacrylate (HDDA), hydroxyethylacrylate (HEA), pentaerytrithol triacrylate (PETA), ethyldiethyleneglycol acrylate (EDGA), tripropyleneglycol diacrylate (TPGDA), or pentaerytrithol tri and tetra acrylate (PETIA).

The method of taking the cyclic reaction to cure the product (IV) is thermopolymerization or photopolymerization. If R' is H, thermopolymerization is chosen to dehydrate and form the thermosetting cycloaliphatic polyimide under a temperature of about 0~400° C., preferably under about 350~400° C. If R' is the acrylate group, photopolymerization is chosen. An initiator is added and then exposed to uv/vis light to induce photopolymerization, forming the photosensitive cyclicaliphatic or cycloaliphatic polyimide. The initiator can be Michler's ketone, tribromomethylphenyl sulfone (TBPS), 2,4-diethyl-9H-thioxanthen-9-one (DTX), isopropyl-9H-thioxanthen-9-one (ITX), 3-acetylcoumarin, 3,3-carbonylbis(7-diethylaminocoumarin), 2-methyl-4'-(methylthio)-2-mor-pholinopropiophenone, benzil(2-ethoxycarbonyl)monoxime, 2,6-bis(4-azidobenzyliolene)-4-methylcyclohexanone, N-(4-azidosulfonylphenyl)-maleinimide, 2-benzyl-2(dimethylamino)-4'-morpholinobutyrophenone, or 2,2-dimethoxy-2-phenylacetophenone.

According to the situation of R' being the acrylate group, a mask having a pattern thereon can be used in the above-mentioned exposure step with the exposure energy of about equal to or smaller than 100 mJ/cm². The development step with a developer is followed to remove the unexposed parts to obtain the patterned cycloaliphatic polyimide film.

Without any intention of limiting itself in any way, the present invention is illustrated further by the following examples.

EXAMPLE 1

0.664 g of 1,3-diamino adamantane and 0.992 g of bicyclo[2.2.2]oct-7-ene-2,3,5,6-tetracarboxylic dianhydride were dissolved in 7 g of NMP solvent to proceed the polycondensation. After purifying, the product, polycyclic aliphatic polyamic acid, was recovered.

0.3 g of the obtained polycyclic aliphatic polyamic acid, 0.7 g of NMP, 0.02 g of Michler's ketone, 0.01 g of benzophenone (as a sensitizer), 0.15 g of trimethylolpropane triacrylate (TMPTA), 500 ppm of p-benzoquinone (as an inhibitor) were mixed. A film made of the obtained mixture with a thickness of 25 μm was formed using a scraper. After soft-baking at 100° C. for 30 minutes, photopolymerization was proceeded by lighting with the exposure energy of 100 mJ/cm² to form the cycloaliphatic polyimide. Then, the development was proceeded with the developer in a 3:2 ratio of 1-methoxyl-2-propanol to NMP in 10 seconds to develop the pattern of the film. The resolution of the patterned film is 25~50 μm.

According to an analysis of the IR and NMR spectra, the cycloaliphatic polyimide has the following formula (V). According to an analysis of the UV and IR spectra, the cycloaliphatic polyimide has a lower absorption coefficient (ε=0~54) in the near-UV light region and the visible light region from 310 nm to 800 nm. The resulting film appears thoroughly transparent.

The analyzed physical properties of the product are as follows: decomposed temperature is 427° C., dielectric constant is 2.69.

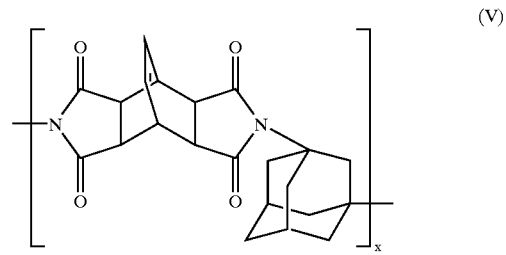

(V)

EXAMPLE 2

0.664 g of 1,3-diamino adamantane and 1.312 g of pentacyclo [$8.2.1.1^{4,7}0^{2,9}0^{3,8}$]tetradecane-5,6,11,12-tetracarboxylic dianhydride were dissolved in 10 g of NMP solvent to proceed the polycondensation. After purifying, the product, polycyclic aliphatic polyamic acid, was recovered.

0.3 g of the obtained polycyclic aliphatic polyamic acid, 0.7 g of NMP, 0.02 g of Michler's ketone, 0.01 g of benzophenone (as a sensitizer), 0.15 g of trimethylolpropane triacrylate (TMPTA), 500 ppm of p-benzoquinone (as an inhibitor) were mixed. A film made of the obtained mixture with a thickness of 25 μm was formed using a scraper. After soft-baking at 100° C. for 30 minutes, photopolymerization was proceeded by lighting with the exposure energy of 100 mJ/cm² to form the cycloaliphatic polyimide. Then, the development was proceeded with the developer in a 3:2 ratio of 1-methoxyl-2-propanol to NMP in 10 seconds to develop the pattern of the film. The resolution of the patterned film is 25~50 μm. The formula (VI) of the final product, cycloaliphatic polyimide, is as follows:

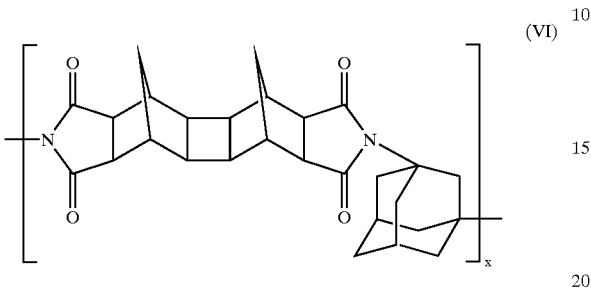
(VI)

In the above two examples, the polycyclic, rigid reactants, 1,3-diamino adamantane and bicyclo[2.2.2]oct-7-ene-2,3,5,6-tetracarboxylic dianhydride, or pentacyclo [8.2.1.$^{4,7}$0$^{2,9}$0$^{3,8}$]tetradecane-5,6,11,12-tetracarboxylic dianhydride, were used to prepare the thermo-cured cycloaliphatic polyamic acid and photo-cured cycloaliphatic polyamic ester, which were then converted to cycloaliphatic polyimide film. The resulting cycloaliphatic polyimide film has a lower inter-molecular charge-transfer interaction and lower intra-molecular charge-transfer interaction, so these can be used to prepare the thorough transparent film. The thermal stability of such film without expansive, fluoro-based compounds can reach over 430° C. Their dielectric constants were reduced to 2.7.

While the present invention is described by illustrative examples and preferred embodiments, it should be understood that the invention is not limited to these examples and embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A cycloaliphatic polyimide represented by the following formula (VI):

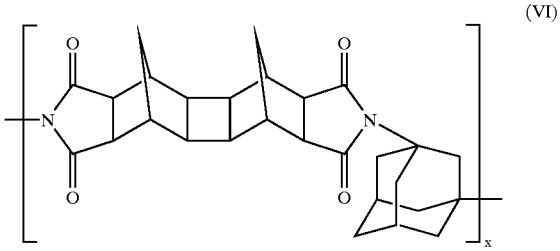
(VI)

wherein
x is an integer equal to or greater than 1.

2. A method for producing a cycloaliphatic polyimide, comprising the following steps:
   (a) polycondensating a polycyclic aliphatic dianhydride having the following formula (III) with a polycyclic aliphatic diamine in the presence of an acrylate to form a product having the following formula (IV); and (b) cyclizing the product (IV) to form a cycloaliphatic polyimide having the following formula (I).

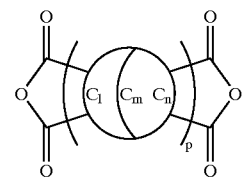
(III)

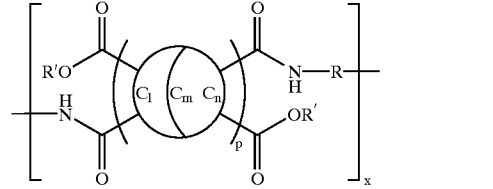
(IV)

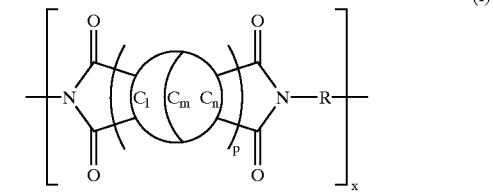
(I)

wherein
R is a cyclic aliphatic group;
$C_l$, $C_m$ and $C_n$ can be alkyl or alkenyl;
l and n are integers from 4 to 7;
m is an integer from 0 to 2;
p is an integer from 1 to 8; and
x is an integer equal to or greater than 1.

3. The method as claimed in claim 2, wherein the acrylate is selected from the group consisting of trimethylolpropane triacrylate (TMPTA), hydroxyethyl methacrylate (2-HEMA), hexanediol diacrylate (HDDA), hydroxyethylacrylate (HEA), pentaerythritol triacrylate (PETA), ethyldiethyleneglycol acrylate (EDGA), tripropyleneglycol diacrylate (TPGDA), and pentaerythritol tri and tetra acrylate (PETIA).

4. The method as claimed in claim 2, wherein the polycondensation is a photopolymerization.

5. The method as claimed in claim 4, wherein the photopolymerization proceeds using an initiator under UV/VIS light.

6. The method as claimed in claim 5, wherein the initiator is selected from the group consisting of Michler's ketone, tribromomethylphenyl sulfone (TBPS), 2,4-diethyl-9H-thioxanthen-9-one (DTX), isopropyl-9H-thioxanthen-9-one (ITX), 3-acetylcoumarin, 3,3-carbonylbis (7-diethylaminocoumarin), 2-methyl-4'-(methylthio)-2-morpholinopropiophenone, benzyl(2-ethoxycarbonyl)monoxime, 2,6-bis (4-azidobenzylidene)-4-methylcyclohexanone, N-(4-azidosulfonylphenyl)-maleinimide, 2-benzyl-2 (dimethylamino)-4'-morpholinobutyrophenone, and 2,2-dimethoxy-2-phenylacetophenone.

7. The method as claimed in claim 4, wherein the photopolymerization proceeds by using a mask with a pattern, and then a development step is followed to develop the pattern on the cycloaliphatic polymide.

8. A photoresist, comprising the cycloaliphatic polyimide as set forth in claim 1.

9. A method for producing a cycloaliphatic polyimide, comprising the following steps:
   (a) polycondensating a polycyclic aliphatic dianhydride having the following formula (III) with a polycyclic aliphatic diamine to form a product having the following formula (IV); and (b) thermopolymerizing the product (IV) to form a cycloaliphatic polyimide having the following formula (I) at a temperature from 0° C. to 400° C.
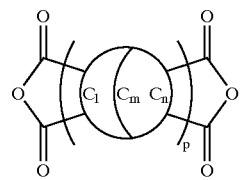
(III)
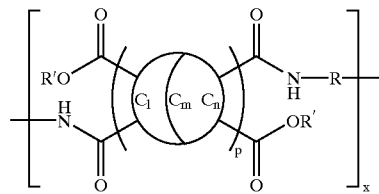
(IV)
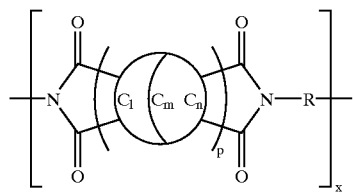
(I)
wherein
R is a cyclic aliphatic group; $C_l$, $C_m$ and $C_n$ can be alkyl or alkenyl;
l and n are integers from 4 to 7;
m is an integer from 0 to 2;
p is an integer from 1 to 8; and
x is an integer equal to or greater than 1.
* * * * *